United States Patent

Curreri et al.

[11] Patent Number: 4,907,177
[45] Date of Patent: Mar. 6, 1990

[54] COMPUTERIZED MULTI-ZONE CRYSTAL GROWTH FURNACE PRECISE TEMPERATURE AND HEATING CONTROL METHOD

[75] Inventors: Victor Curreri, Setauket; John F. Klein, Port Washington; Janine E. Dubois, Shirley, all of N.Y.

[73] Assignee: Grumman Aerospace Corporation, Bethpage, N.Y.

[21] Appl. No.: 264,341

[22] Filed: Oct. 31, 1988

[51] Int. Cl.$^4$ .............................................. G06F 15/46
[52] U.S. Cl. ................................... 364/557; 156/601; 236/15 R; 236/15 BB; 236/15 BF; 364/477
[58] Field of Search ............... 364/557, 477; 373/10, 373/16, 135, 136, 144–145, 147, 117; 374/137; 236/15 A, 15 BR, 15 BB, 15 BF, 15 BG; 237/2 R, 2 A; 431/66–67, 75; 432/36, 49; 156/601, DIG. 73; 422/108, 109

[56] References Cited

U.S. PATENT DOCUMENTS

| | | |
|---|---|---|
| 4,011,430 | 3/1977 | Witkin et al. .................... 373/135 |
| 4,086,424 | 4/1978 | Mellen, Sr. ..................... 156/620.75 |
| 4,373,364 | 2/1983 | Tanimoto et al. ................ 364/477 |
| 4,480,312 | 10/1984 | Wingate ........................ 364/557 |
| 4,501,552 | 2/1985 | Wakamiya ....................... 364/477 |
| 4,577,278 | 3/1986 | Shannon ........................ 364/477 |
| 4,688,180 | 8/1987 | Motomiya ....................... 364/557 |

Primary Examiner—Kevin J. Teska

[57] ABSTRACT

A computerized method of digitally controlling the temperature profile of a heated article in which the temperature profile is defined by a plurality of temperature zones spaced about the article. The temperature profile of the article is monitored and a heating cycle requirement of the temperature zones of the profile is computed. A train of minute increments of power is supplied to heat each respective zone in accordance with the computed heating cycle requirements to achieve a precision approximately between ±0.1° and ±0.5° C. in a temperature range of approximately 400° C. to 1,350° C.

10 Claims, 3 Drawing Sheets

HEATER CONTROL OUTPUT WAVEFORMS FROM PROCESSOR

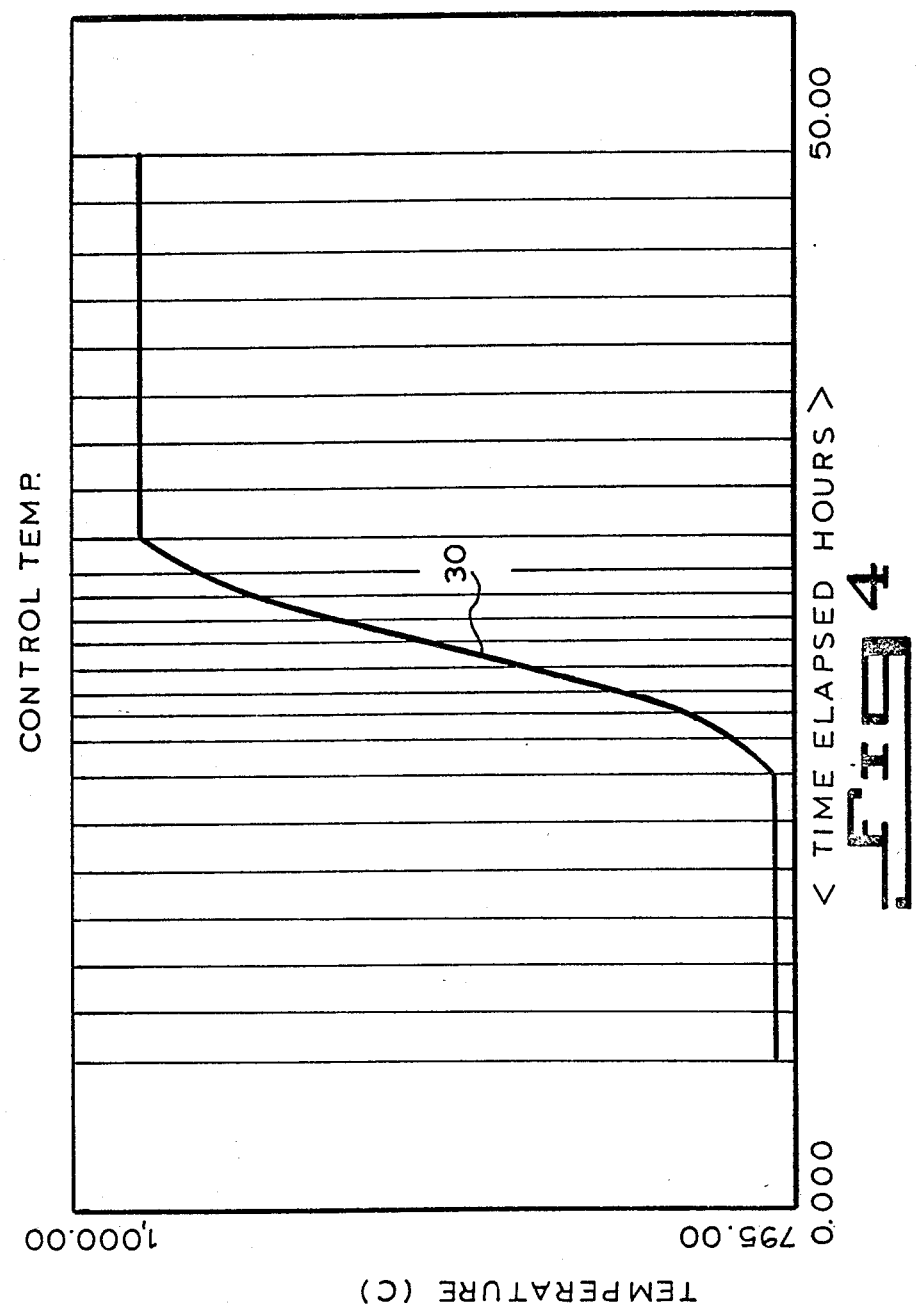

COMPUTERIZED MULTI-ZONE CRYSTAL GROWTH FURNACE PRECISE TEMPERATURE AND HEATING CONTROL METHOD

FIELD OF THE INVENTION

The invention relates to computer controlled furnaces for heating articles, and more particularly to a method for a digital furnace system for precisely controlling temperatures and heating, and wherein temperatures and heating can be maintained, adjusted, monitored and displayed in real time. The method has particular application for the growth and fabrication of crystals.

BACKGROUND OF THE INVENTION

Although computers can rapidly process and respond to received data, it is not always possible for certain systems to take advantage of the computer speed. This is particularly true where peripheral devices have very slow response times, or where a system has inherent inertia.

Furnaces and ovens for heating articles at elevated temperatures are generally not precise, nor quick to respond to temperature changes. Furnace systems generally have a high degree of inertia, wherein the heating elements and temperature monitors respond very slowly to external commands. Heating systems, therefore, tend to be difficult to control, and temperature requirements can rarely be held to exacting tolerances.

In recent years, the need to control furnace temperatures to precise and demanding tolerances has become more critical, particularly in the manufacture of semiconductors and detector materials. Such materials generally require prolonged cycles of heating or cooling at precisely held temperatures or temperature gradients, in order that homogeneous, low-defect crystals can be achieved.

The furnace heating and temperature control method of this invention was conceived having as one of its purposes the growth of cadmium telluride and gallium arsenide crystals having uniform properties. One of the heating requirements for obtaining uniform growth for these crystals is the maintenance of a precise temperature and temperature gradients, at close tolerance over an extended period of time during the growth process.

The furnace system of this invention has been designed to be responsive both quickly and accurately to the commands of a computer.

The furnace system of the invention is capable of maintaining and controlling temperatures to precise tolerances, formerly unachievable in the art.

BRIEF DESCRIPTION OF RELATED ART

A gradient-type furnace for growing crystals, similar to the furnace system of this invention is illustrated in U.S. Pat. No. 4,086,424, issued Apr. 25, 1978.

In the patented furnace, a temperature profile having twenty-one zones is achieved by sequentially powering the heating elements in each zone. While this furnace illustrates the basic concept of a multizone crystal growth furnace, it cannot achieve the necessary temperature accuracy and precision required to provide the character of a gallium arsenide crystal.

For high quality crystals having process reliability, the gallium arsenide crystal must be held to a temperature of extreme precision during the crystal growth process.

One approach to uniform GaAs growth controls arsenic vapour pressure during growth, for example, a temperature of 617° C.±0.1° C. can be used for uniform vapour pressure growth.

The ±0.1 degree tolerance at 617° C. represents a precision of approximately 0.02%.

The aforementioned patented furnace provides no teaching how such an extreme temperature tolerance can be achieved.

The present invention through the use of a computer has developed a system which is capable of achieving the precision required to grow crystals and other high temperature materials.

RELATED APPLICATION

A crystal growth furnace of similar design and construction to the present invention is disclosed in U.S. patent application, Ser. No. 132,224 filed Dec. 14, 1987. Teachings of mutually shared furnace construction and design are meant to be incorporated herein by way of reference.

BRIEF SUMMARY OF THE INVENTION

The invention features a computerized furnace system and method for digitally controlling a temperature profile of a heated article to within precise given limits.

The furnace system comprises a computer which calculates a heat cycle for each heating element in the furnace. There are twenty-four zones in the muffle of the furnace which a crystal material to be heated traverses. A heating element in each zone receives power in the form of a train of electrical pulses which are equidistantly spaced in time in accordance with a calculated heating cycle. Depending upon the deviation from a desired temperature, the train of pulses can vary anywhere from zero to 100 pulses per 100 milliseconds. It is this minute incremental supply of power which provides the precision in the control of a given temperature.

Of course, a major factor in providing such exacting control is being able to quickly and accurately monitor the temperature profile of the heated article. The temperature information is then fed back to the computer which uses a weighted, continuously up-dated average of each temperature value to calculate the instantaneous heat cycle for each zone.

The heat cycle is calculated from a group of algorithmic equations.

The temperature of each zone can be held to a precision of between ±0.1° and ±0.5° C. in a temperature range of approximately 400° C. to 1,350° C., and ±0.1° C. in a temperature range of between 500° C. to 800° C.

One of the reasons that the furnace of the invention was developed, was the need for a heating system for growing crystals of gallium arsenide. In the process of forming the gallium arsenide crystal, there is a critical requirement for holding an arsenic zone temperature of 617° C. to a precision of ±0.1° C. for several hours. This type of precision was not available with present-day commercial systems. The furnace has a power efficiency of about 95% or better by transmitting power using direct current through switching transistors. Similar systems may only be 50 to 70% efficient.

It is an object of the invention to provide an improved furnace system and method for digitally controlling the temperature of a heated article to a precise tolerance.

It is another object of this invention to provide a computerized furnace system wherein the temperature of a heated article is precisely controlled by feeding power to heating elements of the furnace in a train of equidistantly spaced in time electrical pulses.

These and other objects of the invention will become more apparent and will be better understood with reference to the subsequent detailed description considered in conjunction with the accompanying drawings.

BRIEF DESCRIPTION OF THE DRAWINGS

In order that the invention may be readily carried into effect, at will now be described with reference to the accompanying drawings, wherein:

FIG. 4 is a typical temperature profile of the twenty-four temperature zones of the muffle illustrated in FIG. 3.

DETAILED DESCRIPTION OF PREFERRED EMBODIMENT

Figure 1:
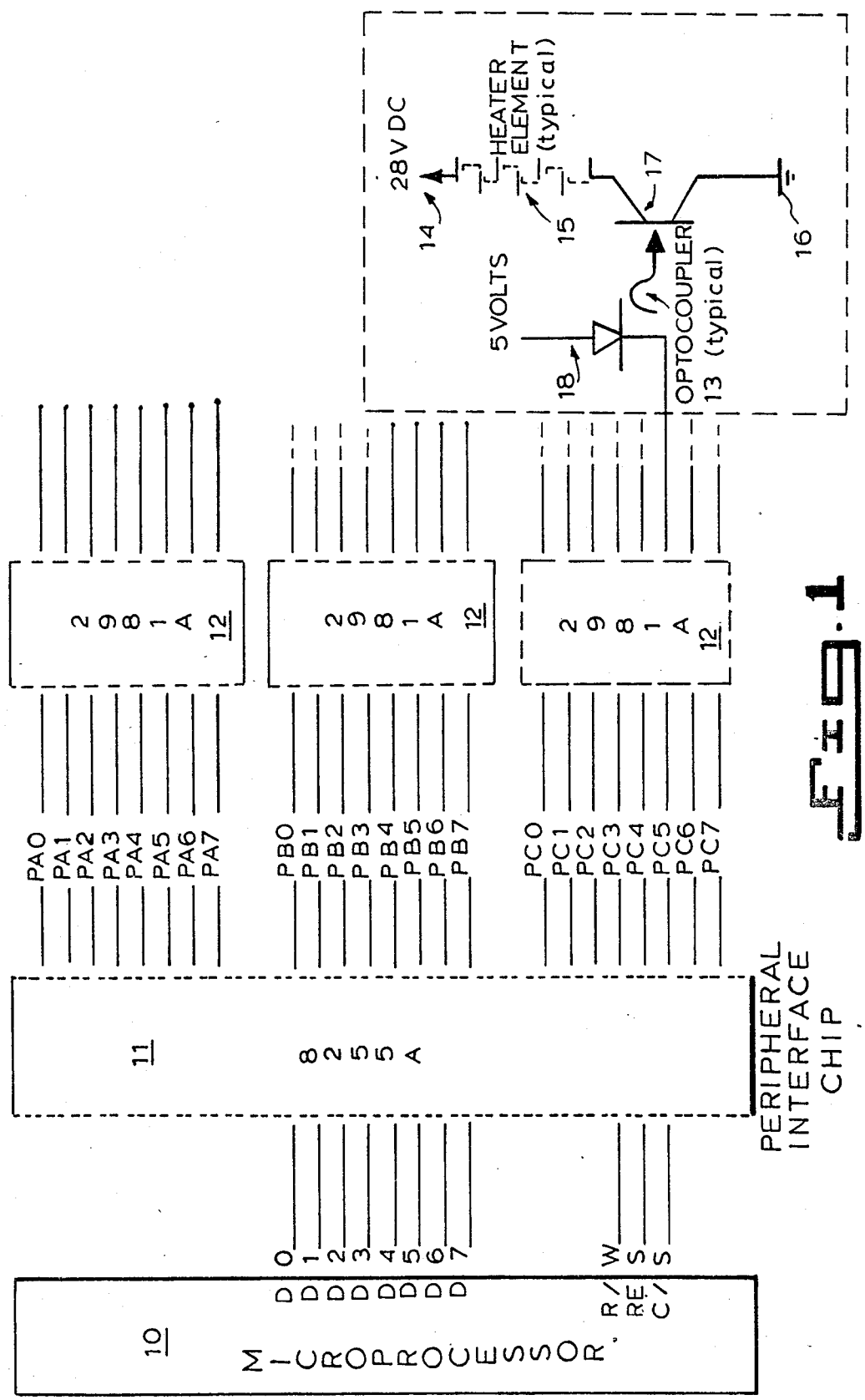
FIG. 1 is a schematic diagram of the furnace system of the invention.

Generally speaking, the invention pertains to a computerized furnace system and method for precisely controlling the temperature of a heated article. The inventive system accomplishes its precise control by feeding power to heat the heating elements of the furnace in a train of uniformly spaced pulses of a minute power increment. The required amount of power is determined from algorithmic equations utilizing monitored temperature readings which are continuously updated.

There are twenty-four zones in the furnace. This provides unique flexibility and contributes to achieving precise control and dynamic response. Some zones are 2 inches long, while others are 1 inch long. Zone lengths and number could be adjusted for different furnace sizes and profiles. The large number of zones allows the temperature profile to be set precisely and held stable during the processing of the material. This ability to set a profile and maintain stability are a significant advance in the state of the art in crystal growth processing.

The present system is designed from commercially available components, are identified by given the same reference numerals in the FIGS.

FIG. 1 is a schematic diagram of the system of the invention. In the system of FIG. 1, a microprocessor 10 issues a plurality of commands through its output (D0 through D7) to a peripheral interface chip 11, which combines with three buffer chips 12 to feed twenty-four heating zones with a train of digital pulses. Twenty-four optical couplers 13 (typical) are electrically connected to the twenty four outputs of the three buffers 12 and isolate the furnace power source 14 from the microprocessor 10.

Each optical coupler 13 comprises a light-emitting diode 18 and a photosensitive transistor coupled to a power switching transistor 17. Each transistor 17 acts in the capacity of a switch, passing power from power source 14 through each heating element 15 (typical) to ground 16, in response to light emitted by its respective LED 18.

The optical couplers 13 provide total electrical isolation between the computer and the power source.

In addition, the digital switching technique provides efficient power transfer to the heating elements.

Figure 3:
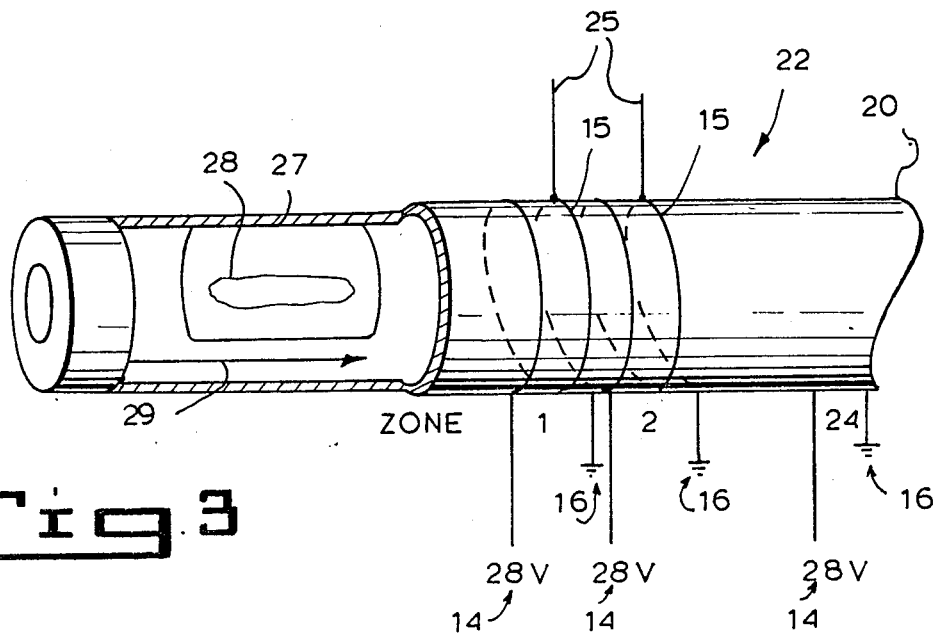
FIG. 3 is a partially cut-away perspective view of a crystal material passing through the muffle of the furnace system of the invention depicted in FIG. 1.

There is a heating element 15 for each heating zone (1 through 24) of the muffle 20 of the furnace (arrow 22), as illustrated in FIG. 3. For purposes of brevity, furnace construction is described in more detail in the aforementioned U.S. patent application, Ser. No. 132,224.

Each heating element 15 is helically wound directly upon and about the muffle 20 and preferably comprises a plurality of turns. This results in a tight coupling of the power input to the physical response of the muffle 20. The muffle 20 is a castable alumina cylinder abut $\frac{1}{8}$ inch thick having an internal diameter of 0.5 to 10.0 inches and a length of 10 to 190 inches. Preferably, the muffle has a 2.5 inch inner diameter, and a 2.75 inch outer diameter, and is approximately 48 inches long. The windings 15 are a platinum/rhodium alloy of 20% rhodium of about 18 or 19 gauge wire. The wound muffle is insulated to retain the heat.

The muffle 20 is anchored at one end as a reference for thermal expansion.

There are several layers of high temperature insulation surrounding the muffle 20. The layer closet to the muffle is zircar felt paper. Proceeding concentrically or radially outward, the materials are: safil blanket, 2600° F. vacuum formed ceramic fiber board and 2300° F. ceramic fiber blanket.

A liquid-cooled outer shell surrounds the furnace insulation. Aluminum is used for the shell material in the current design. Other materials could also be used. Active cooling of the shell also contributes to the furnace stability and response.

Thermal profile capability can be tailored using shunt disks to increase the removal of heat from the furnace.

The windings 15 are encased by a high purity castable alumina ceramic. Castable ceramic thickness can be between 0.060 and 0.500 inches and is preferably about 0.170 inch except in the regions supporting power leads and thermocouples. The castable ceramic extends about 1.5 inches beyond the end of the windings 15.

The radial portion of the power leads (not shown in the FIGS.) are triple twisted. The triple twisted leads are encased in segmented one hole ceramic tubing as they traverse radially inward from power connectors. Segmented ceramic tubes are used to provide both high temperature insulation and flexibility of the leads. Slack is allowed in the leads to accommodate motion due to the expansion of the muffle 20 as its temperature is raised. A two hole ceramic is used where the two leads enter the castable ceramic layer. Lead separation and mechanical support are provided by the two hole ceramic. Triple twist lead wire is encased directly into the castable ceramic after passing through the two hole ceramic. Loads on the leads are on triple wire rather than a single wire. Half round ceramics are used to locally cover the winding power leads from adjacent zones where they start to run radially outward. These ceramics insulate adjacent zones from each other.

Additional castable ceramic is built up to support the power leads and two hole ceramics. A trapezoidal cross-sectional region (not shown in the FIGS.) running the length of the muffle 20 results. This region is about 0.5 inch wide at its outer edge.

A thermocouple 25 (typical) is associated with each zone (1 through 24) to measure the instantaneous temperature to provide a real time temperature profile 30 of the furnace system, as shown in FIG. 3. The profile 30, illustrated in FIG. 4, is continuously updated, by dropping one of a group of readings, every time a new temperature is obtained.

All 24 zones are interrogated in 2.4 seconds. The thermocouples 25 are each interrogated sequentially, by the microprocessor 10 on the average of once every 100 milliseconds, and a weighted average can be obtained in accordance with the first algorithmic equation shown in Table I, below:

TABLE I

PID EQUATIONS

| | |
|---|---|
| Weighted average | $a = c/n + ((1 - 1/n) * oa)$ |
| Derivative | $d = (a - oa)/t$ |
| Error | $e = s - a - (kd * d)$ |
| Integral | $i = ((e + oe/2 * t) + oi$ |
| Proportional power | $p = (e * kp) + (i * ki)$ |
| Percent duty cycle | $dy = p * ks$ |

Key to Variable Names

| | | | |
|---|---|---|---|
| a | = weighted average | oa | = previous weighted average |
| c | = control TC reading | | |
| d | = derivative | | |
| dy | = % duty cycle | | |
| e | = error | oe | = previous error |
| i | = integral | oi | = previous integral |
| kd | = derivative constant | | |
| ki | = integral constant | | |
| kp | = power constant | | |
| ks | = scaling constant | | |
| n | = number of terms in weighted average (smoothing) | | |
| p | = proportional power | | |
| s | = setpoint | | |
| t | = interval time between previous reading and current reading | | |

Thermocouples 25 for each zone are located equidistantly from the ends of each of the windings 15. They are positioned to avoid potential contact with the windings 15, if the castable ceramic cracks. Thermocouples 25 are located between 0.03 to 0.375 inch radially outward from the outer surfaces of the winding and preferably about 0.170 inch. They are held in place by a fixture while the castable ceramic is applied and for the curing of the castable ceramic. The thermocouple leads are encased in segmented ceramic tubing to provide flexibility for thermal expansion of the muffle. Slack is provided in the leads. The last ceramic segment is supported by a castable ceramic build-up similar to that used for the power leads.

Some of the system constants or scaling factors are obtained on a test basis after the system is built.

Each zone can be heated or cooled to a given temperature according to a predetermined menu or heat ramping procedure, which can be stored in a memory (not shown in the FIGS.). Such a procedure can be derived by making a few test runs.

The microprocessor 10 will calculate from the weighted averages for each zone a power input or duty cycle corresponding to the additional heat required to control or maintain a given zone temperature, in accordance with the last algorithmic equation of Table I.

Figure 2:
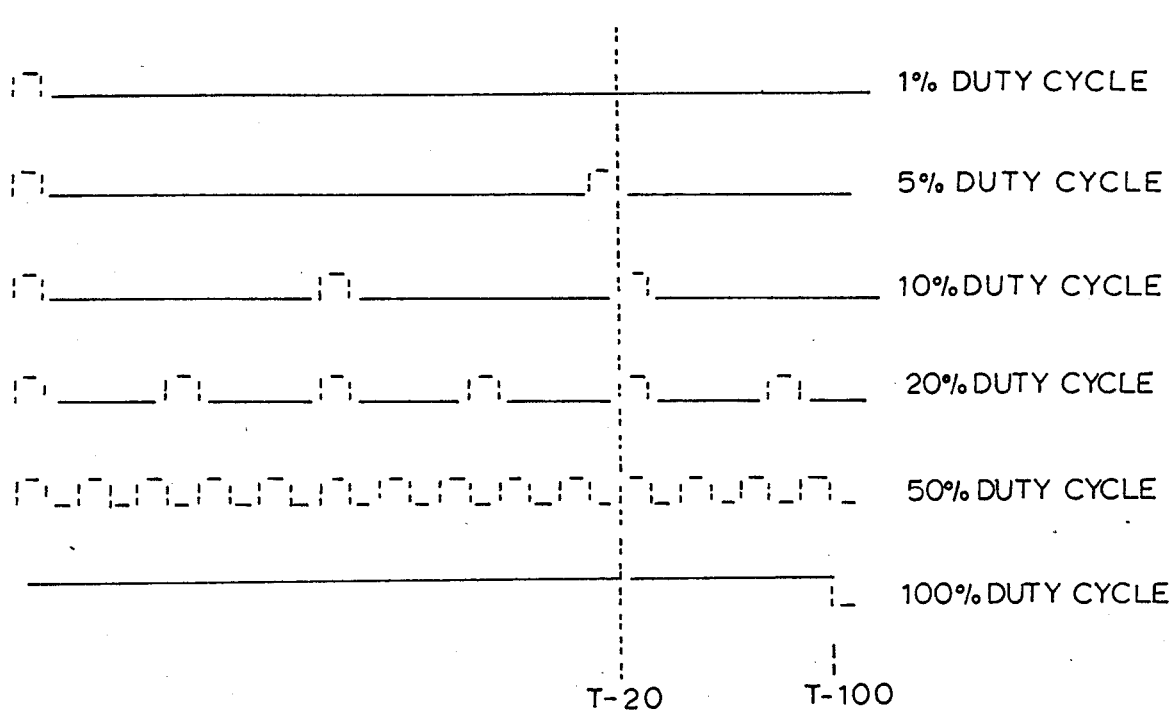
FIG. 2 is a diagrammatic view of the pulsed wave forms generated by the microprocessor shown in FIG. 1.

The power input for heat control can range anywhere from 0% to 100% of full power, as shown in FIG. 2.

A 1% duty cycle, for example, will provide just one power pulse per 100 milliseconds to a respective heating element 15, while a 20% duty cycle will provide twenty equidistantly spaced pulses in time per 100 milliseconds.

It is this minutely incremental and instantaneous feeding of power which provides the unique temperature control of the system. Of course, the switching transistors 17, must be able to respond within the duty cycle pulse rate set for the system. Each transistor 17 of this invention has a response time of approximately 50 $\mu$s. Each pulse supplies between 20 and 810 watts per millisecond.

It is also contemplated, that the duty cycle can be more finely incremented by providing a duty cycle with a one thousand pulse per 100 millisecond rate, if so desired.

With respect to the temperature monitoring, the thermocouples 25 must not only be as accurate or precise as the tolerance to which the temperature of each zone is to be controlled, but also they must have a response time which falls within the interrogation cycle.

The cycle time for each zone takes about 160 milliseconds to interrogate. As part of each interrogation cycle, the percent duty for each zone is updated. Several zones are interrogated in parallel. The effective average cycle time is about 100 milliseconds. The 24 zones are interrogated sequentially. All the zones are interrogated and updated about every 2.4 seconds.

All thermocouple outputs will be boosted through a calibrated amplifier. The amplified outputs will then be inputted to the microprocessor 10 through 14 or 16 bit analog-to-digital converters (not shown in the FIGS.). In accordance with the method of the invention, these combined circuits will provide a measurement precision for each thermocouple of + or −0.005% (or 5 parts in one hundred thousand). The thermocouples 25 are controllable by the method of the invention to a precision of + or −0.005% (or 5 parts in one hundred thousand).

The thermocouples 25 are provided by Grumman Aerospace Corporation.

The process for fabricating a gallium arsenide crystal starts with an ampoule 27 about 6 inches long containing a raw gallium arsenide ingot 28, shown in FIG. 3. The ampoule 27 is fed (arrow 29) into muffle 20 and then exposes to a sequence of carefully controlled temperature changes. The first change applies melting temperature to the ampoule (high temperature). The second change allows cooling from the high temperature to the low temperature (adiabatic). The third change applies low temperature or freeze temperature to the ampoule. The fourth change controls its curing to room temperature. Table II shows the temperatures and tolerances required:

TABLE II

| TEMPERATURE ZONES | |
|---|---|
| High Temp. | About 1250° C. ± 1° C. for 10 hrs. |
| Adiabatic Zone | Cools from 1250° C. to 1150° C. for 50 hrs. |
| Low Temp. | About 1150° C. ± 1° C. for 10 hrs. |

The ampoule 27 with its GaAs ingot 28 can be mechanically moved through the system, or the system can provide relative movement of temperatures electronically.

The entire process takes about 80 hours, in which time the ampoule 27 and ingot 28 move about 7 to 8 inches. Table III below shows the oven temperature gradients. The ampoule 27 must pass through from left to right. The first is the melt zone where the GaAs raw material 28 is heated to a melt. The second is the adiabatic zone where the melted material slowly cools from 1250° C. to 1150° C. and the crystal is formed. The third is the freeze zone where the crystal becomes stable and solid. The fourth is the arsenic zone where gas is released from the arsenic and absorbed by the forming material.

TABLE III

| 1250° C. <Melt Zone> | Natural Cooling <Adiabatic Zone> Natural Cool from 1250 to 1150 → | 1150° C. <Freeze Zone> Heat Out of Ampule | Natural Cooling <Cooling Zone> | 617° C. <Arsenic Zone> |
|---|---|---|---|---|
| 1st Stage Melt | 2nd Stage Gradual Cooling → → | 3rd Stage Freeze | Ramp Down to Room Temperature | |
| Heat Into Ampule | | | | |

Naturally, it is to be understood that other crystal fabrications will require a different temperature gradient and sequence.

The GaAs crystal fabrication described herein is meant to be a teaching of one such crystal that can be fabricated with the invention.

Having thus described the invention, what is desired to be protected by Letters Patent is presented by the subsequently appended claims.

What is claimed is:

1. A computerized method of digitally controlling a temperature profile of a heated article to within precise given limits, said method comprising the steps of
    (a) monitoring the temperature profile of a heated article, said temperature profile being definable by a plurality of temperature zones spaced about said article;
    (b) computing a respective heating cycle requirement for each of said temperature zones of said profile necessary to control a given temperature to an approximate precision of between ±0.1° and ±0.5° C. in a temperature range of approximately 400° C. to 1,350° C.; and
    (c) initiating by computer command and supplying a train of minute increments of power to heat each respective zone in accordance with the requirements of the computed heating cycle, said increments of power comprising a train of electrical pulses substantially equidistantly spaced in time and ranging from zero to 100 pulses per 100 milliseconds.

2. The method of claim 1, wherein each electrical pulse supplies approximately between 20 and 810 watts of power per millisecond.

3. The method of claim 1, wherein said given temperature is controlled to a precision of ±0.1 degree in a temperature range of approximately 500° C. to 800° C.

4. The method of claim 1, wherein the power required for heating is determined by averaging several of the previously monitored temperatures for each zone.

5. The method of claim 1, wherein each zone temperature is monitored in real time.

6. The method of claim 1, wherein the zone temperatures are sequentially monitored.

7. The method of claim 6, wherein there are twenty-four zones and the zone temperatures are sequentially monitored on the average of approximately once every 100 milliseconds and wherein all the zones are monitored in approximately 2.4 seconds.

8. The method of claim 1, wherein a computer calculates the heating cycle for providing a train of pulses to optically coupled means, which in turn causes power pulses to be fed to heating elements in a heating system.

9. The method of claim 8, wherein said optically coupled means comprises a plurality of light-emitting diodes and associated photosensitive transistors, said light-emitting diodes receiving computer commands to emit light pulses in accordance with a calculated heating cycle, and said photosensitive transistors optically switching on power to respective heating elements in each zone in response to said emitted light pulses.

10. The method of claim 9, wherein a train of pulses is supplied to each zone ranging from zero to 1,000 pulses per 100 milliseconds.

* * * * *

UNITED STATES PATENT AND TRADEMARK OFFICE
CERTIFICATE OF CORRECTION

PATENT NO. : 4,907,177

DATED : March 6, 1990

INVENTOR(S) : VICTOR CURRERI ET AL

It is certified that error appears in the above-identified patent and that said Letters Patent is hereby corrected as shown below:

Abstract (item) 57, lines 10 and 11, " 0.1° and 0.5°C" should be -- 0.1° and 0.5°C --

Column 3, line 52, "are" should be --which are--

Column 6, line 18, "also they must" should be --they must also-- line 43, "exposes" should be --exposed--

Signed and Sealed this

Twenty-first Day of July, 1992

Attest:

DOUGLAS B. COMER

Attesting Officer

Acting Commissioner of Patents and Trademarks